(12) United States Patent
Lim

(10) Patent No.: US 6,690,613 B2
(45) Date of Patent: Feb. 10, 2004

(54) HIGH VOLTAGE GENERATING CIRCUIT AND METHOD

(75) Inventor: Kyu-Nam Lim, Gyeonggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/076,235

(22) Filed: Feb. 13, 2002

(65) Prior Publication Data

US 2002/0118589 A1 Aug. 29, 2002

(30) Foreign Application Priority Data

Feb. 23, 2001 (KR) .......................................... 2001-9331

(51) Int. Cl.[7] .............................................. G11C 16/30
(52) U.S. Cl. ................................. 365/226; 365/189.09
(58) Field of Search ................................ 365/226, 229, 365/189.11, 189.09

(56) References Cited

U.S. PATENT DOCUMENTS 5,337,284 A * 8/1994 Cordoba et al. ............. 365/227
5,796,293 A * 8/1998 Yoon et al. .................. 327/536

* cited by examiner

Primary Examiner—Michael S. Lebentritt
Assistant Examiner—Jung H. Hur
(74) Attorney, Agent, or Firm—Marger Johnson & McCollom, P.C.

(57) ABSTRACT

A high voltage generating circuit includes a standby high voltage generating means and an active high voltage generating means. The standby high voltage generating means detects a level of a high voltage in both a standby mode and an active mode to boost the high voltage when the level of the high voltage is lower than a predetermined level. The active high voltage generating means varies a voltage boosting ability responsive to a control signal when an active command is applied in the active mode to thereby boost the level of the high voltage. The active high voltage generating means also detects whether the level of the high voltage is lower than the predetermined level to adjust a level of the control signal.

20 Claims, 13 Drawing Sheets

HIGH VOLTAGE GENERATING CIRCUIT AND METHOD

This application claims priority from Korean Patent Application No. 2001-9331, filed on Feb. 23, 2001, the entirety of which is incorporated by reference.

BACKGROUND OF THE INVENTION

1. Field of the Invention

The present invention relates to a high voltage generating circuit and method.

2. Description of Related Art

Apparatus using a battery as a power source generally include a high voltage generating circuit that internally generates a voltage higher than a battery voltage. Likewise, typical semiconductor memory devices include a high voltage generating circuit that generates a voltage level higher than an externally applied power voltage.

A typical high voltage generating circuit includes a standby high voltage generating circuit that operates in both standby and active modes and an active high voltage generating circuit that operates only in active mode. Of these, the active high voltage generating circuit boosts a high voltage to a desired level responsive to an active command.

FIG. 1 is a block diagram illustrating a high voltage generating circuit. The high voltage generating circuit of FIG. 1 includes a standby high voltage generating circuit 100 and an active high voltage generating circuit 200. The standby high voltage generating circuit 100 includes a standby high voltage detecting circuit 10, an oscillator 12, and a standby high voltage step-up circuit 14. The active high voltage generating circuit 200 includes an active high voltage detecting circuit 20, a pulse generating circuit 22 and an active high voltage step-up circuit 22. The standby high voltage detecting circuit 10 determines whether a level of a high voltage VPP is lower than a desired or predetermined voltage level to thereby generate a standby high voltage level detecting signal VPPS. The oscillator 12 oscillates responsive to the standby high voltage level detecting signal VPPS to thereby generate a pulse signal OSC. The standby high voltage step-up circuit 14 boosts a level of the high voltage VPP responsive to the pulse signal OSC.

The active high voltage detecting circuit 20 detects whether a level of the high voltage VPP is lower than a desired level to thereby generate an active high voltage level-detecting signal VPPA responsive to an active command ACT. The pulse signal generating circuit 22 generates pulse signals P1 and P2 responsive to the active command ACT and the high voltage level detecting signal VPPA is generated. The active high voltage step-up circuit 24 boosts the high voltage VPP responsive to the pulse signals P1 and P2.

A predetermined time period is required until the active command ACT is applied and a level of the high voltage VPP is detected. During this predetermined time period, a level of the high voltage VPP is stepped down. Therefore, a level of the high voltage VPP cannot be compensated directly after the active command ACT is applied.

FIG. 2 is a block diagram illustrating another embodiment of a high voltage generating circuit. The high voltage generating circuit of FIG. 2 includes a standby high voltage generating circuit 100 and an active high voltage generating circuit 210. The standby high voltage generating circuits of FIGS. 1 and 2 have like configuration. The active high voltage generating circuit 210 includes an active high voltage detecting circuit 30, a pulse signal generating circuit 32, a first active high voltage generating circuit 34, and a second high voltage generating circuit 36.

The active high voltage detecting circuit 30 generates the high voltage level detecting signal VPPA when a level of the high voltage VPP is lower than a desired level responsive to an active command ACT. The pulse signal generating circuit 32 generates pulse signals p1 and p2 when the active command ACT is applied. Likewise, the pulse signal generating circuit 32 generates pulse signals P1 and P2 responsive to the active command ACT and the high voltage level detecting signal VPPA. The first active high voltage generating circuit 34 boosts the high voltage VPP responsive to the pulse signals p1 and p2. The second active high voltage generating circuit 36 boosts the high voltage VPP responsive to the pulse signals P1 and P2.

That is, the first active high voltage generating circuit 34 boosts the high voltage VPP responsive to the pulse signals p1 and p2 generated by the pulse signal generating circuit 32 and responsive to the active command ACT. The second active high voltage generating circuit 36 boosts the high voltage VPP responsive to the pulse signals P1 and P2 generated by the pulse signal generating circuit 32. The second active high voltage generating circuit 36 boosts the high voltage VPP also responsive to the high voltage level detecting signal VPPA generated by the active high voltage detecting circuit 30.

Therefore, the high voltage generating circuit of FIG. 2 has an advantage in that the first active high voltage generating circuit 34 operates directly after receiving the active command ACT to immediately boost the high voltage VPP.

However, if the first and second high voltage generating circuits 34 and 36, respectively, are designed considering receiving a low boosting ability power voltage where a high power voltage is applied, the first and second high voltage generating circuits 34 and 36 come to have a high voltage boosting ability and, therefore, the high voltage may be boosted higher than the desired voltage.

That is, since a voltage boosting ability of the high voltage generating circuit of FIG. 2 differs according to the power voltage level, the level of the high voltage VPP also differs.

SUMMARY OF THE INVENTION

It is an object of the present invention to overcome disadvantages associated with prior art circuits.

It is another object of the present invention to provide a high voltage generating circuit that can provide a stable high voltage regardless of a level of a high voltage input.

It is another object of the present invention to provide a method of generating a high voltage in which a stable high voltage can be provided regardless of a level of a high voltage input.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts.

DETAILED DESCRIPTION OF PREFERRED EMBODIMENTS

Reference will now be made in detail to preferred embodiments of the present invention, examples of which are illustrated in the accompanying drawings.

Figure 1:
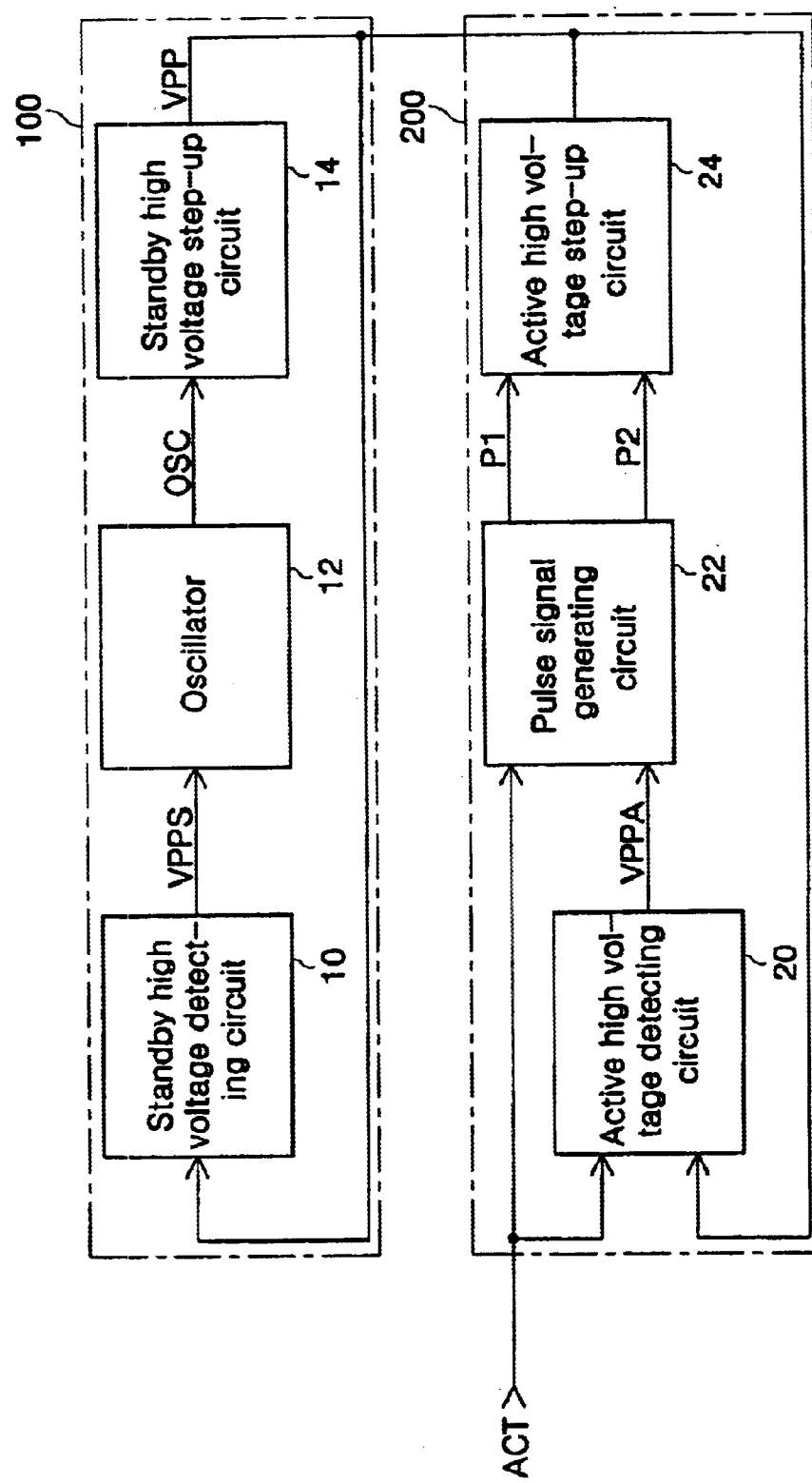
FIG. 1 is a block diagram of a high voltage generating circuit.
Figure 2:
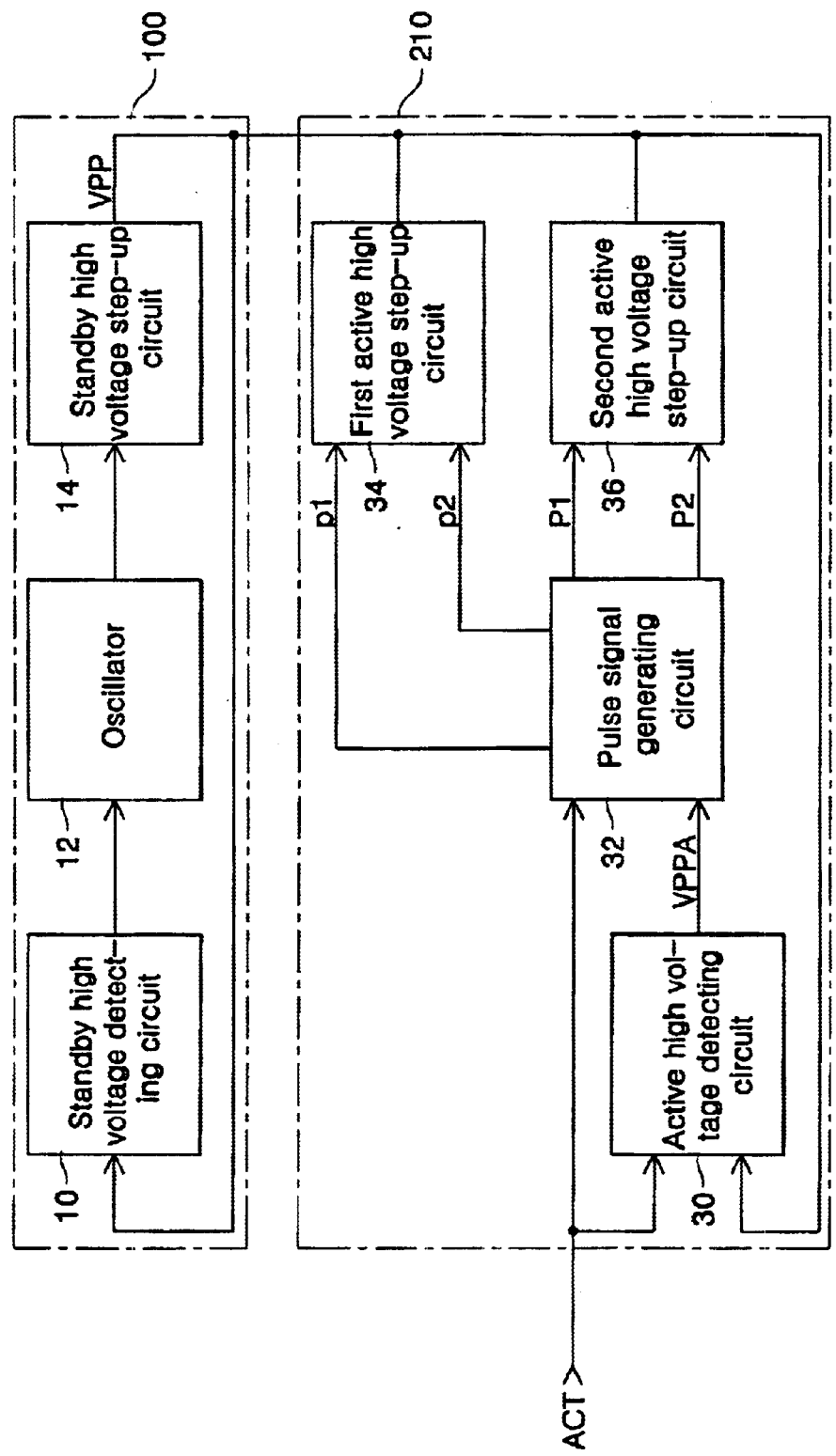
FIG. 2 is a block diagram of another embodiment of a high voltage generating circuit.
Figure 3:
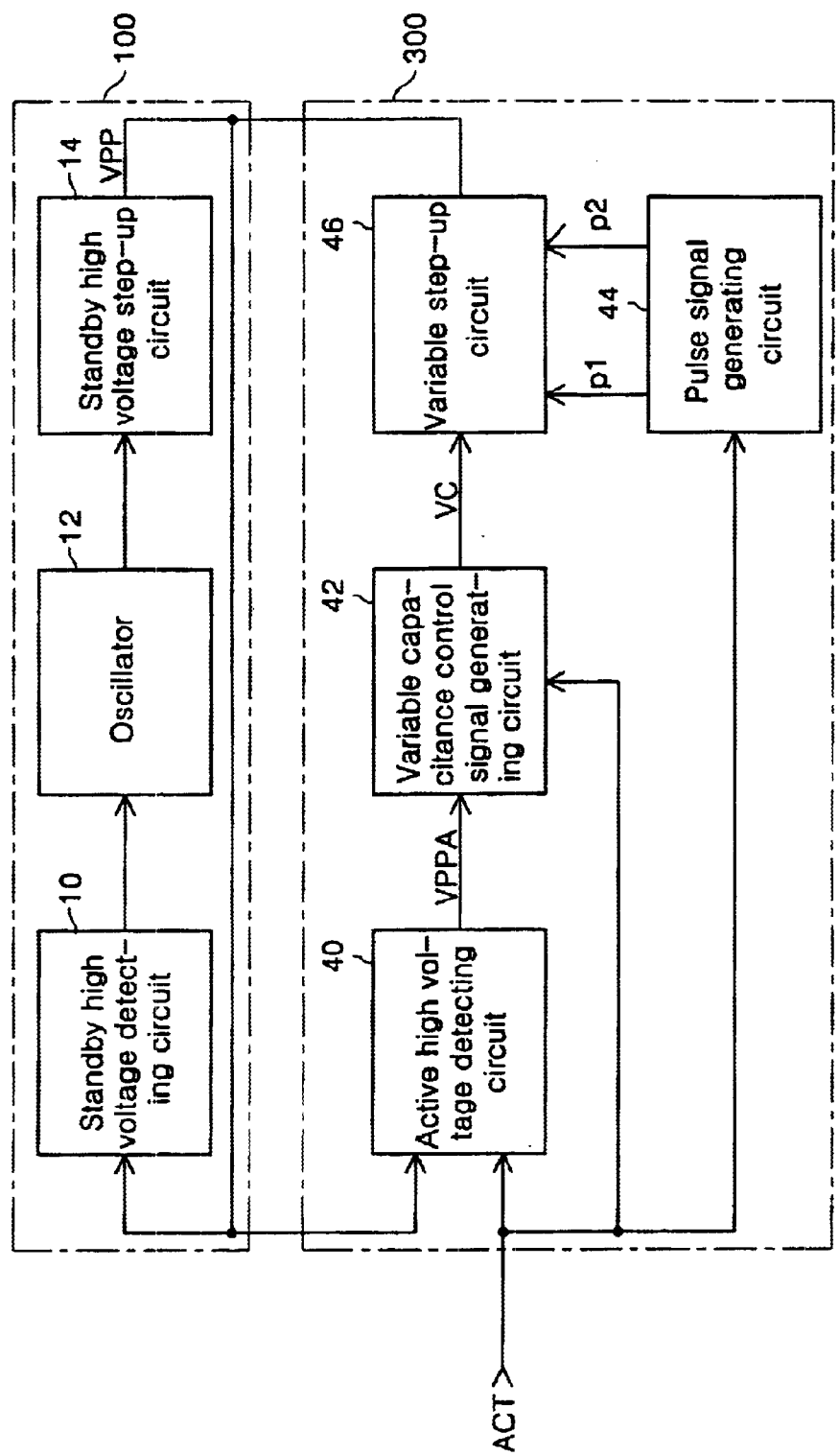
FIG. 3 is a block diagram of a high voltage generating circuit according to an embodiment of the present invention.

FIG. 3 is a block diagram of an embodiment of a high voltage generating circuit according to the present invention. The high voltage generating circuit of FIG. 3 includes a standby high voltage generating circuit 100 and an active high voltage generating circuit 300. The standby high voltage generating circuits of FIGS. 1 and 3 have like configuration. The active high voltage generating circuit 300 includes an active high voltage detecting circuit 40, a variable capacitance control signal generating circuit 42, a pulse signal generating circuit 44, and a variable step-up circuit 46, replacing the active high voltage generating circuit 200 shown in FIG. 1.

The active high voltage detecting circuit 40 generates a high voltage level detecting signal VPPA when an active command ACT is applied and a level of a high voltage is lower than a desired voltage level. For example, when a level of the high voltage is lower than the desired level, a high voltage level detecting signal having a logic "high" level is generated. The variable capacitance control signal generating circuit 42 varies a voltage level of a control signal VC responsive to the high voltage level detecting signal VPPA and the active command ACT. For example, when the active command ACT is applied and the high voltage level detecting signal VPPA having a logic "high" level is generated, the variable capacitance control signal generating circuit 42 increases a voltage level of the control signal VC.

The pulse signal generating circuit 44 generates pulse signals p1 and p2 responsive to the active command ACT. The variable step-up circuit 46 makes its voltage boosting ability variable responsive to the control signal VC. The variable step-up circuit 46 boosts the high voltage VPP responsive to the pulse signals p1 and p2. For example, a voltage boosting ability of the variable step-up circuit 46 increases when a voltage level of the control signal VC is low and decreases when a voltage level of the control signal VC is high. Therefore, when a level of the high voltage VPP is lower than a desired voltage level, the variable step-up circuit 46 increases its voltage boosting ability responsive to the control signal VC to thereby boost the high voltage VPP. In contrast, when a level of the high voltage VPP is higher than a desired voltage level, the variable step-up circuit 46 decreases its voltage boosting ability responsive to the control signal VC to thereby boost the high voltage VPP. That is, the variable step-up circuit 46 can boost the high voltage VPP immediately after receiving the active command ACT.

Therefore, the inventive active high voltage generating circuit can perform a voltage boosting operation immediately without the necessity of waiting a predetermined time after receiving the active command ACT.

Also, when the inventive voltage generating circuit is designed in consideration that a low power voltage is applied, even though a high power voltage is applied, a stable high voltage can be generated because the voltage boosting ability of the variable step-up circuit 46 is variable.

Figure 4:
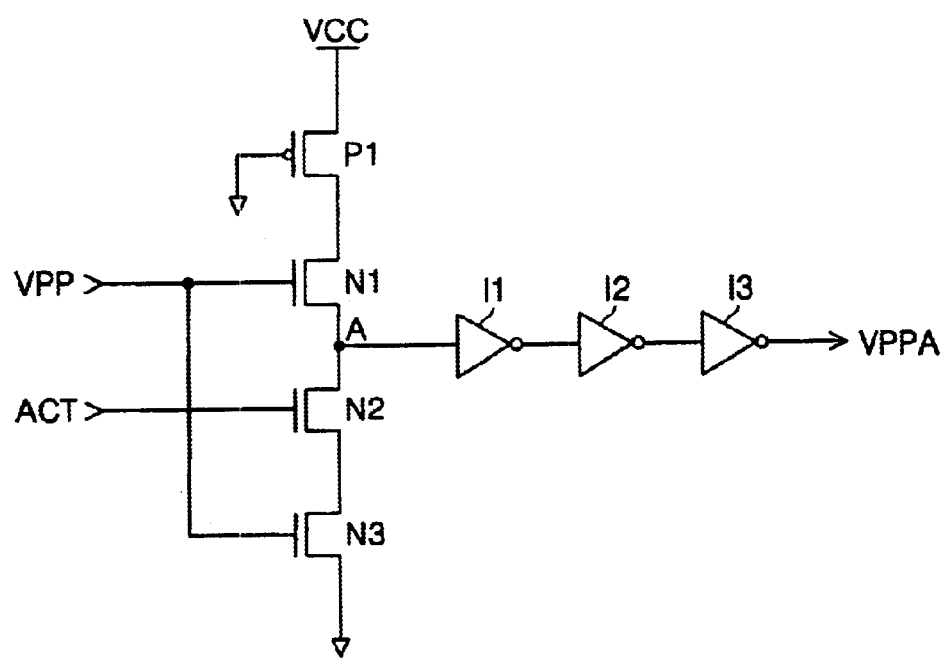
FIG. 4 is a circuit diagram of a configuration of the active high voltage detecting circuit of FIG. 3.

FIG. 4 is a circuit diagram illustrating a configuration of the active high voltage detecting circuit shown in FIG. 3. The active high voltage detecting circuit of FIG. 4 includes a PMOS transistor P1, NMOS transistors N1 to N3, and inverters I1 to I3.

The PMOS transistor P1 and the NMOS transistor N1 are serially connected between a power voltage VCC and a node A. A gate of the PMOS transistor P1 is connected to a ground, and a gate of the NMOS transistor N1 is connected to the high voltage VPP. The NMOS transistors N2 and N3 are serially connected between the node A and a ground. A gate of the NMOS transistor N2 is connected to the active command ACT, and a gate of the NMOS transistor N3 is connected to the high voltage VPP. The inverters I1 to I3 invert and buffer a signal of the node A to generate the high voltage level detecting signal VPPA.

The PMOS transistor P1 and the NMOS transistors N1 to N3 of FIG. 4 constitute a voltage follower.

The active high voltage detecting circuit generates the high voltage level detecting signal VPPA having a logic "low" level when the high voltage VPP is higher than the desired voltage level, and generates the high voltage level detecting signal VPPA having a logic "high" level when the high voltage VPP is lower than the desired voltage level.

Figure 5:
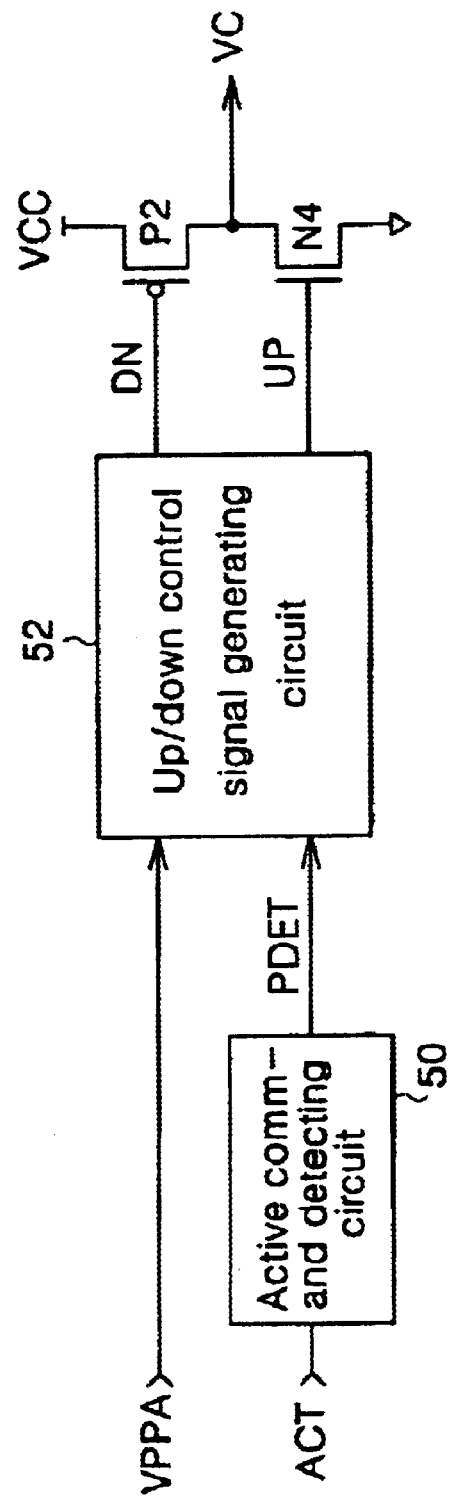
FIG. 5 is a block diagram of a variable capacitance control signal generating circuit of FIG. 3.

FIG. 5 is a block diagram of the variable capacitance control signal generating circuit of FIG. 3. The variable capacitance control signal generating circuit of FIG. 5 includes an active command detecting circuit 50, an up/down control signal generating circuit 52, a PMOS transistor P2, and an NMOS transistor N4. The PMOS transistor P2 and the NMOS transistor N4 are serially connected between the power voltage VCC and a ground voltage. The PMOS transistor P2 includes a gate receiving a down signal ("DN"), and the NMOS transistor N4 includes a gate receiving an up ("UP") signal is applied.

When the active command ACT is applied, after a predetermined time period, the active command detecting circuit 50 generates an active command detecting signal PDET responsive to detecting a transition of the active command ACT to a logic "high" level. The active command detecting signal PDET includes a predetermined pulse width. If the active command detecting signal PDET is not generated, the up/down control signal generating circuit 52 generates the up signal UP having a logic "low" level and the down signal DN having a logic "high" level to turn off the PMOS transistor P2 and the NMOS transistor N4. And in case that the active command detecting signal PDET is generated, and the high voltage VPP is lower than the desired level, when the high voltage level detecting signal VPPA having a logic "high" level is generated, the up signal UP and the down signal DN that have all a logic "high" level are generated. At that time, the NMOS transistor N4 is turned on to lower a level of the control signal VC. On the other hand, in case that a level of the high voltage VPP is higher than a wanted level, when the high voltage level detecting signal VPPA having a logic "high" level is generated, the up signal UP and the down signal DN that have all a logic "low" level are generated. At that time, the PMOS transistor P2 is turned on increasing a level of the control signal VC. The resistance values of the PMOS transistor P2 and the NMOS transistor N4 become large, so that the control signal VC rises and falls steadily.

Figure 6:
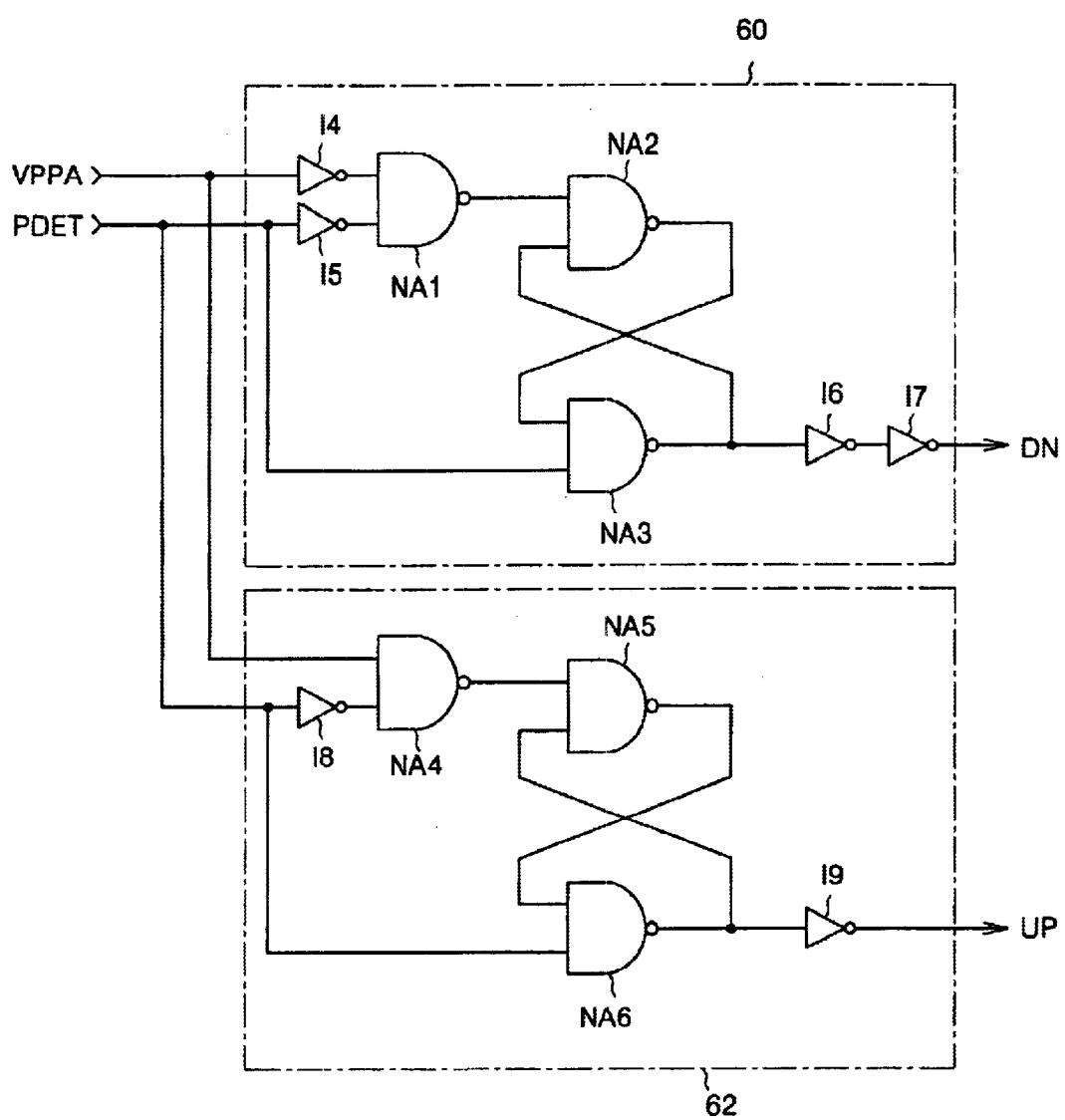
FIG. 6 is a circuit diagram of an up/down control signal generating circuit of FIG. 5.

FIG. 6 is a circuit diagram of the up/down control signal generating circuit of FIG. 5. The up/down control signal generating circuit of FIG. 5 includes a down signal generating circuit 60 and an up signal generating circuit 62.

The down signal generating circuit 60 includes inverters I4 to I7 and NAND gates NA1 to NA3. The up signal generating circuit 62 includes inverters I8 and I9 and NAND gates NA4 to NA6.

The down signal generating circuit 60 generates a down signal DN having a logic "high" level by the NAND gate NA3 and the inverters I6 and I7 responsive to a logic "low" active command detecting signal PDET.

When the active command detecting signal PDET having a logic "low" level and the high voltage level detecting signal VPPA having a logic "low" level are generated, the NAND gate NA1 generates a signal having a logic "low" level and the NAND gate NA2 generates a signal having a logic "high" level. In this state, when the active command detecting signal PDET is transited from a logic "low" level to a logic "high" level, the NAND gate NA3 and the inverters I6 and I7 generate the down signal DN having a logic "low" level. When the active command detecting signal PDET is transited from a logic "high" level to a logic "low" level, the down signal DN transits from a logic "low" level to a logic "high" level. When the active command detecting signal PDET having a logic "low" level and the high voltage level detecting signal VPPA having a logic "high" level are generated, the NAND gate NA1 generates a signal having a logic "high" level and the NAND gate NA2 generates a signal having a logic "low" level. In this state, when the active command detecting signal PDET is transited from a logic "low" level to a logic "high" level, the NAND gate NA3 and the inverters I6 and I7 generate the down signal DN having a logic "high" level.

In case that the active command is applied and the active command detecting signal PDET is generated, the down signal generating circuit 60 generates the down signal DN having a logic "high" level when the high voltage level detecting signal VPPA has a logic "high" level at a rising edge of the active command detecting signal PDET and generates the down signal DN having a logic "low" level when the high voltage level detecting signal VPPA has a logic "low" level at a rising edge of the active command detecting signal PDET. When the active command detecting signal PDET is reset from a logic "high" level to a logic "low" level, the down signal DN is reset to a logic "high" level.

An operation of the up signal generating circuit 62 will be understood with reference to an operation of the down signal generating circuit 60 described above.

Figure 7A:
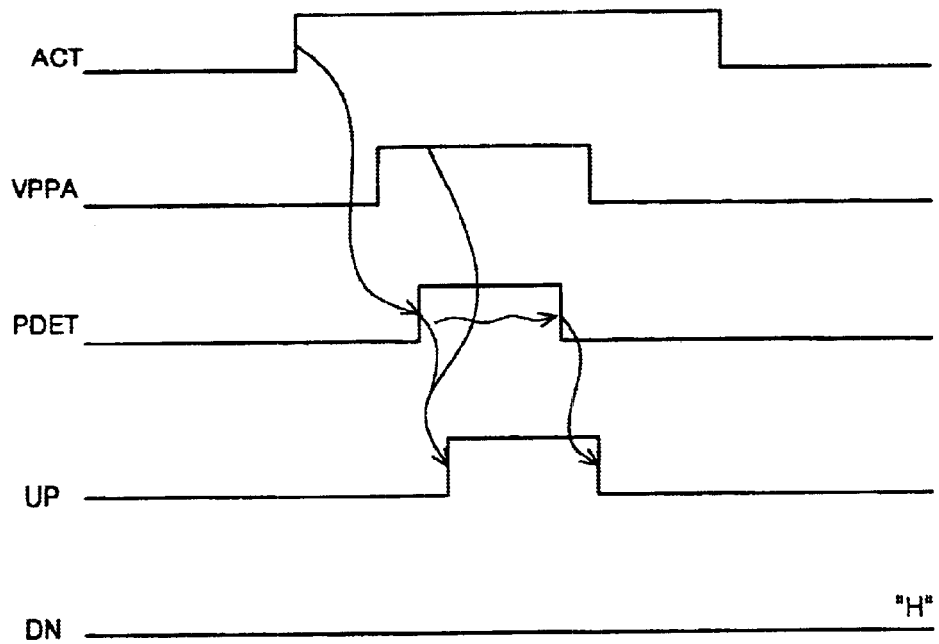
FIG. 7A is a timing diagram of the operation of the variable capacitance control signal generating circuit when a high voltage level detecting signal having a logic "high" level is applied.
Figure 7B:
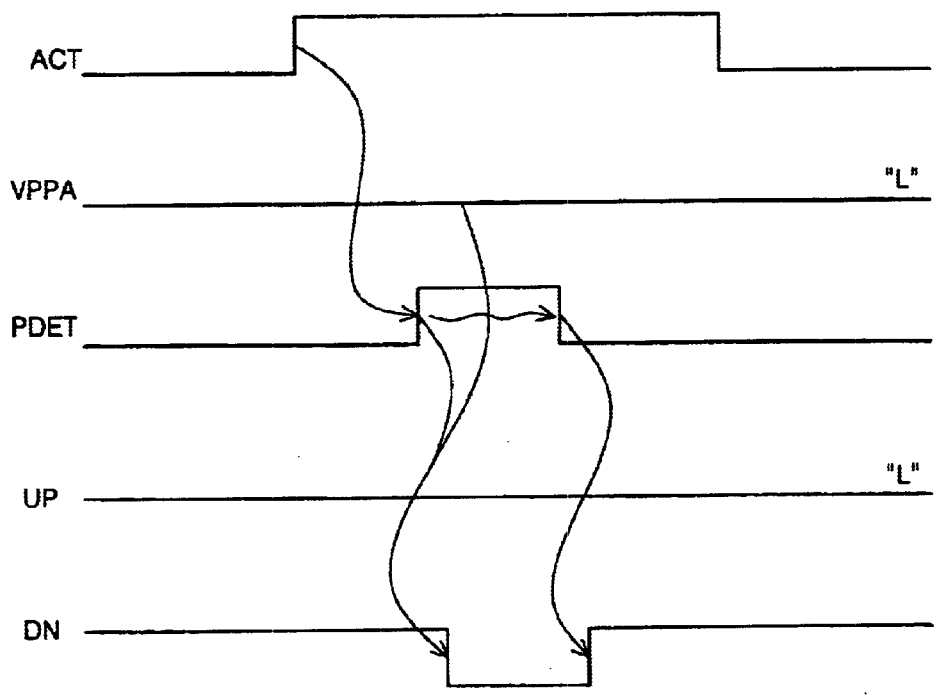
FIG. 7B is a timing diagram of the operation of the variable capacitance control signal generating circuit when the high voltage level detecting signal having a logic "low" level is applied.

FIG. 7A is a timing diagram of an operation of the variable capacitance control signal generating circuit when the high voltage level detecting signal VPPA having a logic "high" level is applied. FIG. 7B is a timing diagram of an operation of the variable capacitance control signal generating circuit when the high voltage level detecting signal VPPA having a logic "low" level is applied.

Referring to FIGS. 7A and 7B, when the active command ACT is not applied, the up signal UP having a logic "low" level and the down signal DN having a logic "high" level are generated. The active command detecting signal PDET is a pulse signal generated when a predetermined time period passes after the active command ACT is generated and a pulse signal generated later than the high voltage level detecting signal VPPA.

As shown in FIG. 7A, in case that the active command ACT is generated and the active command detecting signal is transited from a logic "low" level to a logic "high" level, when the high voltage level detecting signal VPPA having a logic "high" level is detected, the up signal UP having a logic "high" level is generated and the down signal DN remains to a logic "high" level. When the active command detecting signal PDET is transited from a logic "high" level to a logic "low" level, the up signal UP is transited from a logic "high" level to a logic "low" level.

As shown in FIG. 7B, in case that the active command ACT is generated and the active command detecting signal is transited from a logic "low" level to a logic "high" level, when the high voltage level detecting signal VPPA having a logic "low" level is detected, the down signal DN having a logic "low" level is generated and the up signal UP remains to a logic "low" level. When the active command detecting signal PDET is transited from a logic "high" level to a logic "low" level, the down signal DN is transited from a logic "low" level to a logic "high" level.

Figure 8:
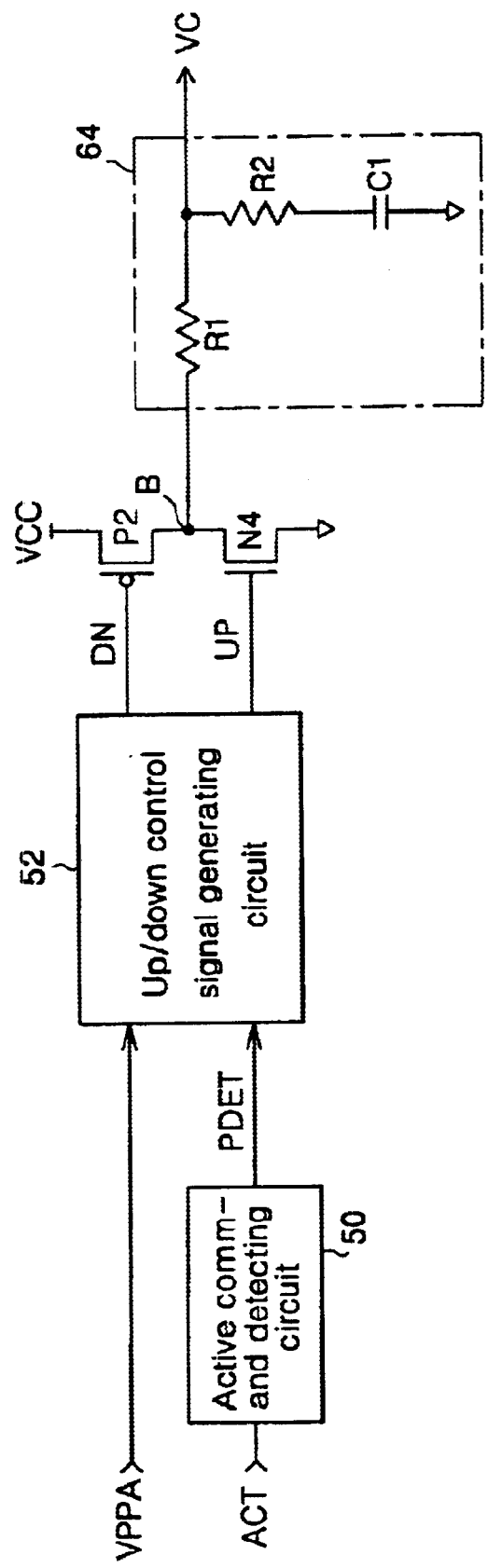
FIG. 8 is a circuit diagram of another variable capacitance control signal generating circuit.

FIG. 8 is a circuit diagram of another embodiment of the variable capacitance control signal generating circuit. The variable capacitance control signal generating circuit of FIG. 8 additionally includes a loop filter 64 in addition to a configuration of the variable capacitance control signal generating circuit of FIG. 5. The loop filter 64 includes resistors R1 and R2 and a capacitor C1.

In the variable capacitance control signal generating circuit of FIG. 8, a control signal is generated to a node B responsive to the high voltage level detecting signal VPPA. However, the control signal generated to the node B may include a noise component. The loop filter 64 removes a noise component contained in the control signal generated to the node B to generate a control signal VC. Also, by adjusting a capacitance of the capacitor C1 of the loop filter 64, deterioration of the control signal VC can be controlled.

Figure 9:
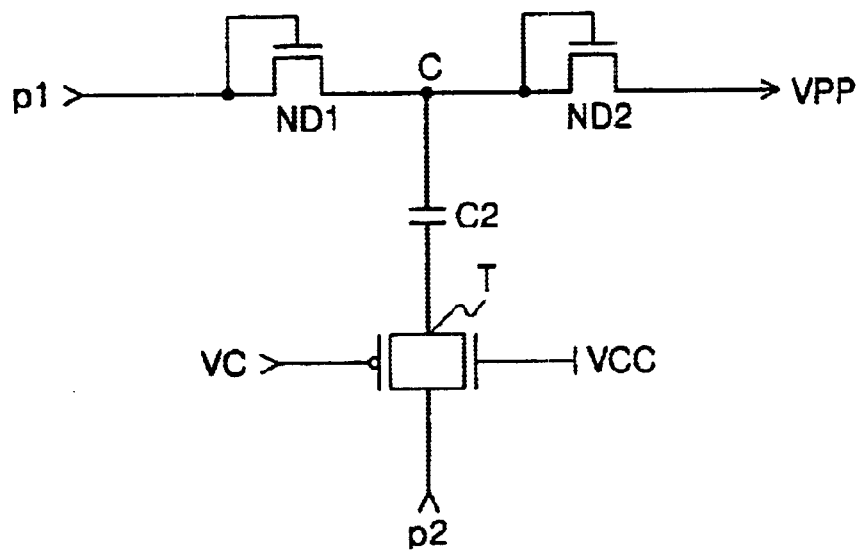
FIG. 9 is a circuit diagram of a variable step-up circuit.

FIG. 9 is a circuit diagram of a variable step-up circuit. The variable step-up circuit of FIG. 9 includes diode-connected NMOS transistors ND1 and ND2, a capacitor C2 and a CMOS transmission gate T. The NMOS transistor ND1 includes a gate and a drain which are connected to a terminal of applying a pulse signal p1 and a source connected to a node C. The NMOS transistor ND2 includes a gate and a drain that are connected to the node C and a source connected to a terminal of generating a high voltage VPP. The capacitor C2 and the CMOS transmission gate T are serially connected between the node C and a terminal of applying a pulse signal p2. The control signal VC is applied to a gate of a PMOS transistor, a power voltage VCC is applied to a gate of the NMOS transistor.

Figure 10:
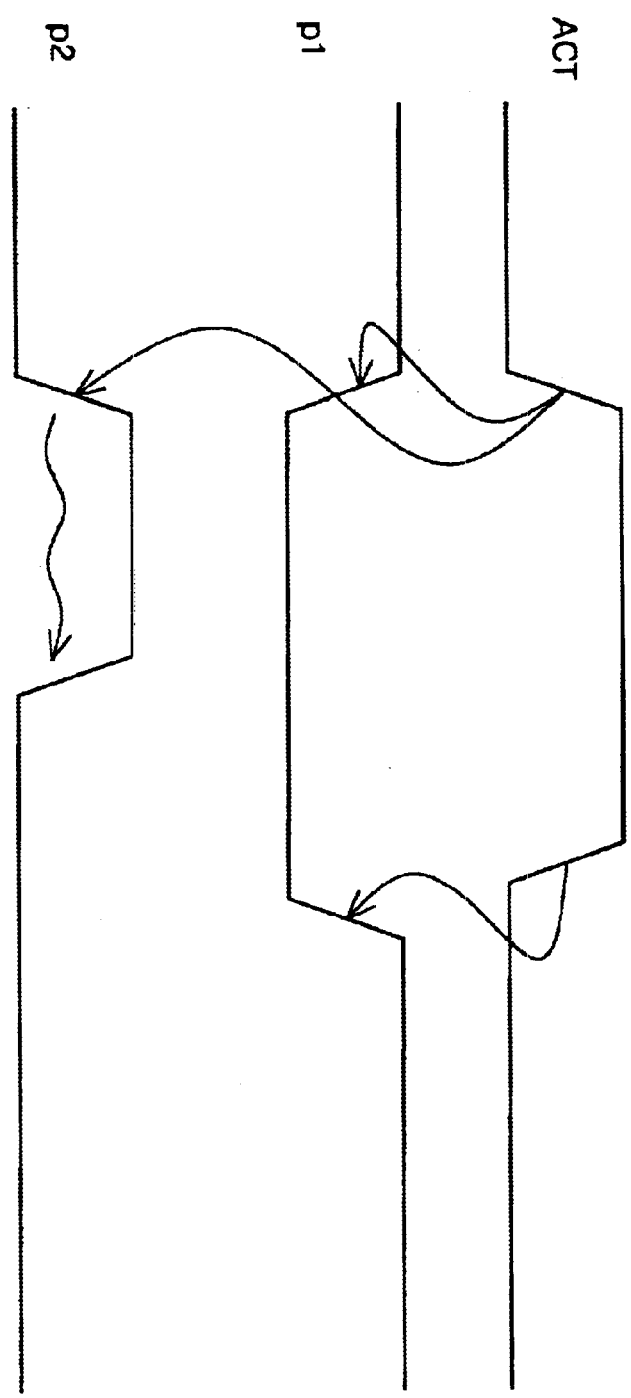
FIG. 10 is a timing diagram of an active command and a pulse signals.

An operation of the variable step-up circuit of FIG. 9 is as follows. FIG. 10 is a timing diagram of the active command ACT and the pulse signals p1 and p2.

As shown in FIG. 10, the pulse signals p1 and p2 are generated with opposing phase relative to each other by the pulse signal generating circuit 44 of FIG. 3 responsive to the active command ACT. That is, when the active command ACT is transited from a logic "low" level to a logic "high" level, the pulse signal p1 is transited from a logic "high" level to a logic "low" level. When the active command ACT is transited from a logic "high" level to a logic "low" level, the pulse signal p1 is transited from a logic "low" level to a logic "high" level. When the active command ACT is transited from a logic "low" level to a logic "high" level, the pulse signal p2 is transited from a logic "low" level to a logic "high" level and after a predetermined time, the pulse is transited from a logic "high" level to a logic "low" level.

When the pulse signal p1 having a logic "high" level and the pulse signal p2 having a logic "low" level are applied, the NMOS transistor ND1 is turned on, so that a voltage that the power voltage VCC minus a threshold voltage Vt of the NMOS transistor ND1 is charged to the capacitor C2.

When the pulse signal p1 having a logic "low" level and the pulse signal having a logic "high" level are applied, the NMOS transistor ND1 is turned off, and the node C is boosted to a voltage "(2VCC-Vt)'a", where "a" is a function of the control signal VC. At this moment, when a voltage level of the control signal VC is relatively low, a voltage at node C is rapidly boosted. When a voltage level of the control signal VC is relatively high, a voltage of the node C is more slowly boosted. So when a voltage of the node C is boosted to a level higher than the high voltage VPP, the NMOS transistor ND2 is turned on to boost the high voltage VPP.

In FIG. 9, the control signal is applied to only the PMOS transistor that constitutes the CMOS transmission gate T. The reason is that it is necessary to control a capacitance when the pulse signal p2 is transited from a logic "low" level to a logic "high" level, but it is not necessary to control a capacitance when the pulse signal p2 is transited from a logic "high" level to a logic "low" level. That is, since there is no need to control a capacitance when a voltage is charged to the capacitor C2 through the NMOS transistor ND1, the variable step-up circuit of FIG. 9 applies the power voltage VCC to a gate of the NMOS transistor that constitutes the CMOS transmission gate T to always maintain an on-state.

Figure 11:
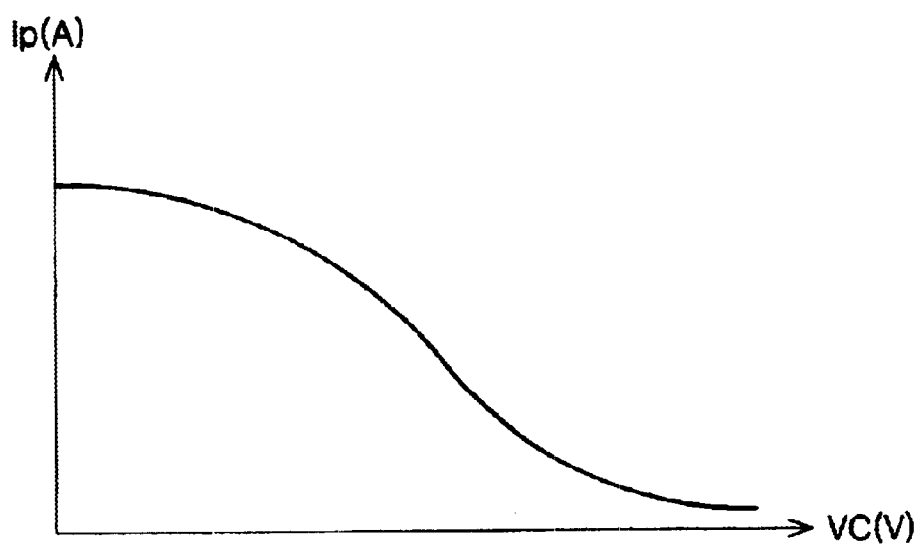
FIG. 11 is a graph of a boosting current with respect to the control signal in the variable step-up circuit of FIG. 9.

FIG. 11 is a graph of a boosting current with respect to the control signal in the variable step-up circuit of FIG. 9. In the graph of FIG. 11, the boosting current Ip is a current flowing along the capacitor C when the pulse signal p1 is transited from a logic "high" level to a logic "low" level, and the pulse signal p2 is transited from a logic "low" level to a logic "high" level.

As the control signal VC increases, a channel of the PMOS transistor that constitutes the CMOS transmission gate T is gradually closed. That is, a boosting voltage at node C is decreased. Therefore, when a size of the control signal VC is relatively small, a boosting voltage of the node C increases, so that an amount of a boosting current boosted by the pulse signal p2 is relatively large. Conversely, when a size of the control signal VC is relatively large, a boosting voltage at node C is decreased, so that an amount of a boosting current boosted by the pulse signal p2 is relatively small.

Figure 12:
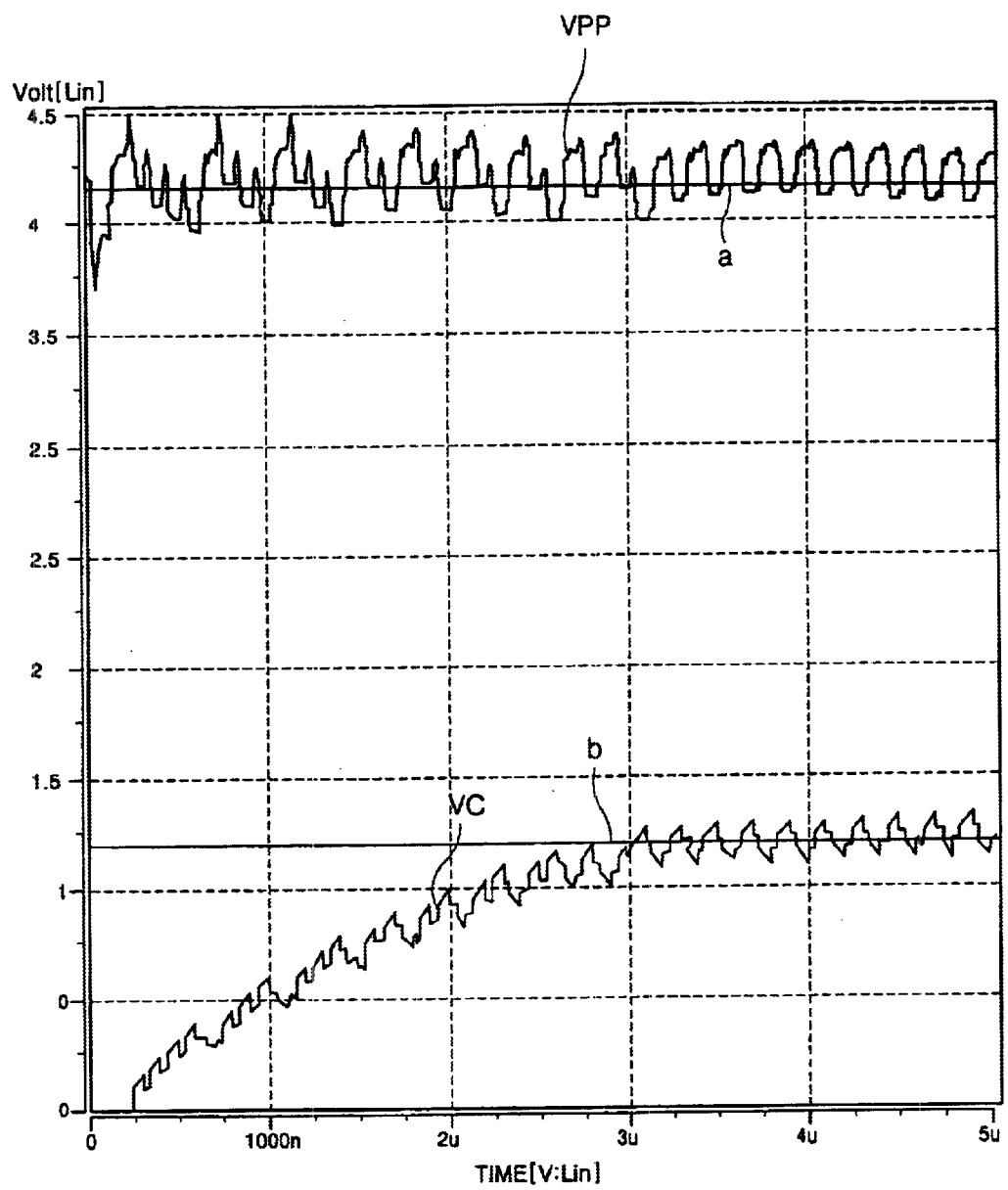
FIG. 12 is a simulation graph of an operation of a high voltage generating circuit according to the preferred embodiment of the present invention.

FIG. 12 is a simulation graph of an operation of the high voltage generating circuit according to the preferred embodiment of the present invention. In particular, FIG. 12 shows a variation of the high voltage VPP and the control signal VC according to a time period "t" when a continuous active operation is performed.

In the graph of FIG. 12, a line "a" denotes a wanted level of the high voltage VPP, and a line "b" denotes a desired level of the control signal VC. A graph VPP denotes a variation of the high voltage, and a graph VC denotes a variation of the control signal. As a time increases, with the control signal VC repeatedly performing rising and a falling operations, a level of the control signal VC increases steadily until being adjusted to the desired voltage level. Also, with the high voltage VPP repeatedly performing rising and falling operations according to the rising and falling operations of the control signal VC, a level of the high voltage VPP is adjusted to the desired voltage level.

As shown in FIG. 12, when the control signal VC reaches the desired voltage level at about 3 ms, the control signal VC continuously moves, maintaining a predetermined width at the desired level. Also, when the high voltage VPP reaches a desired level at about 3 ms, the high voltage VPP continuously moves, maintaining a predetermined width at the desired level.

Figure 13:
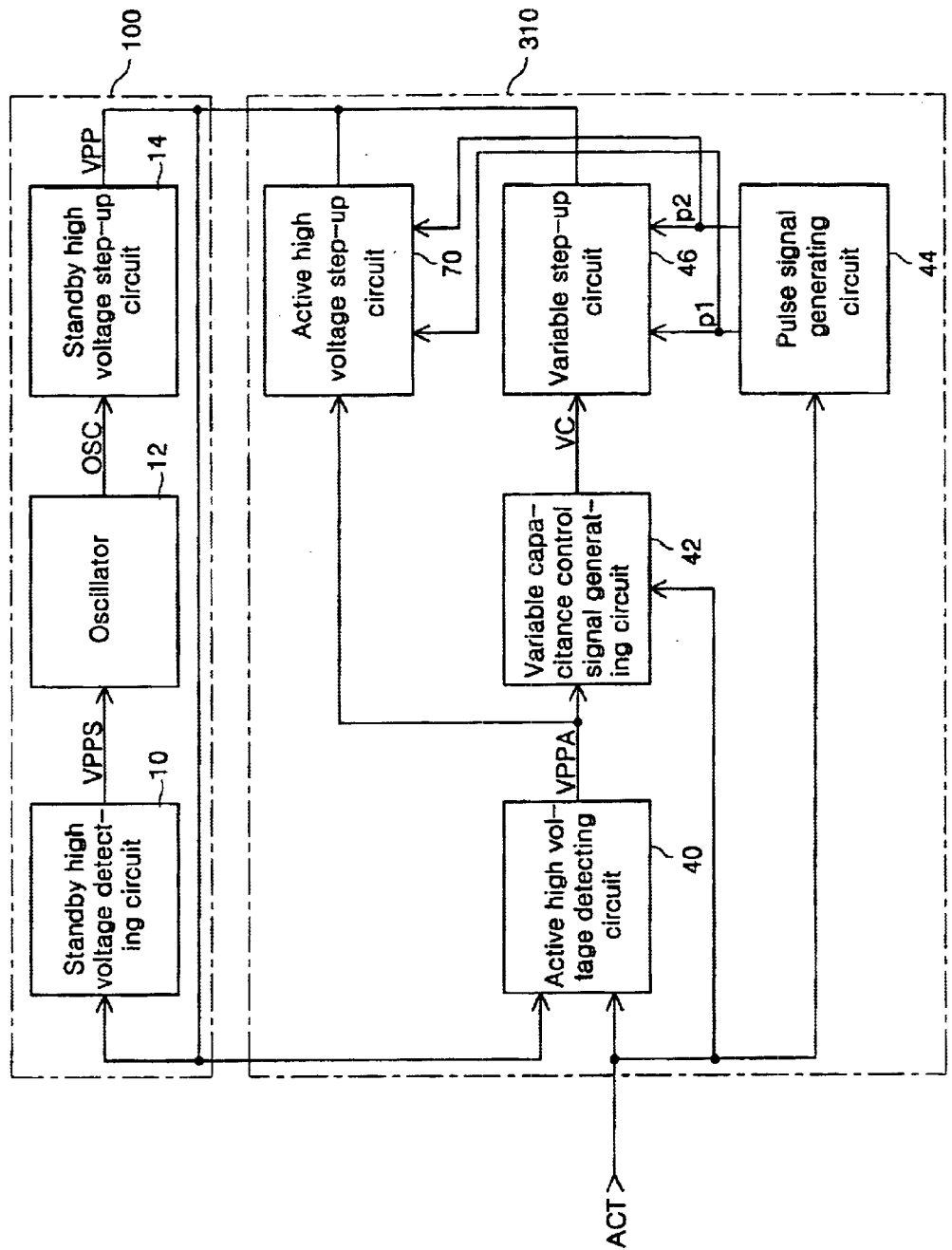
FIG. 13 is a block diagram of another embodiment of a high voltage generating circuit.

FIG. 13 is a block diagram of another high voltage generating circuit according to an embodiment of the present invention. The high voltage generating circuit of FIG. 13 includes standby high voltage generating circuit 100 and an active high voltage generating circuit 310. The standby high voltage generating circuits of FIG. 3 and FIG. 13 have like configuration. The active high voltage generating circuit 310 of FIG. 13 additionally includes an inverter I5 and an active high voltage step-up circuit 70 to the active high voltage generating circuit 300 of FIG. 3.

The active high voltage step-up circuit 70 boosts the high voltage VPP responsive to the pulse signals p1 and p2 generated from the pulse signal generating circuit 44 when the high voltage level detecting circuit VPPA is generated from the active high voltage detecting circuit 40.

The high voltage generating circuit of FIG. 13 operates the variable step-up circuit 46 to boost the high voltage VPP responsive to the active command ACT, and the active high voltage step-up circuit 70 boosts the high voltage VPP when the active high voltage detecting circuit detects that a level of the high voltage VPP is lower than the desired voltage level.

In the high voltage generating circuit of FIG. 13, in an active mode, the variable step-up circuit 46 operates to boost the high voltage VPP without any time delay. Then, when it is detected that a level of the high voltage VPP is lower than a wanted level, the active high voltage step-up circuit 70 operates to boost the high voltage VPP, whereby a stable high voltage VPP can be generated.

As described herein before, the high voltage generating circuit according to the preferred embodiment of the present invention can boost the high voltage immediately by the variable step-up circuit when the active command is applied. Also, since a voltage boosting capacitance of the variable step-up circuit is controlled by the control signal, regardless of a level of the power voltage, a stable high voltage can be generated.

While the invention has been particularly shown and described with reference to preferred embodiments thereof, it will be understood by those skilled in the art that the foregoing and other changes in form and details may be made therein without departing from the spirit and scope of the invention, as recited in the claims.

What is claimed is:

1. A high voltage generating circuit, comprising:
   a standby high voltage generating means for detecting a level of a high voltage and to boost the level of the high voltage when the level of the high voltage is lower than a predetermined level; and
   an active high voltage generating means for variably boosting the level of the high voltage responsive to a control signal and an active command and, to adjust a level of the control signal responsive to detecting the level of the high voltage relative to the predetermined level.

2. The circuit of claim 1 wherein the active high voltage generating means includes:
   a variable step-up circuit for variably boosting the level of the high voltage responsive to the control signal and a plurality of pulse signals;
   an active high voltage detecting circuit for detecting whether a level of the high voltage is lower than the predetermined level responsive to the active command to thereby generate an active high voltage detecting signal;
   a variable capacitance control signal generating circuit for varying a level of the control signal responsive to the active high voltage detecting signal and the active command; and
   a pulse signal generating circuit for generating the plurality of pulse signals responsive to the active command.

3. The circuit of claim 2 wherein the active high voltage generating means further includes an active high voltage step-up circuit being enabled responsive to the active high voltage detecting signal and boosting the level of the high voltage responsive to the plurality of pulse signals.

4. The circuit of claim 2 wherein the variable step-up circuit includes:
   a first circuit for boosting a voltage boosting node responsive to a first pulse signal of the plurality of pulse signals;
   a second circuit for varying the voltage boosting ability responsive to the control signal and to boost the voltage boosting node responsive to a second pulse signal of the plurality of pulse signals, the second pulse signal having an opposing phase to the first pulse signal; and
   a third circuit for boosting the level of the high voltage when a level of the voltage boosting node is higher than a predetermined level of the high voltage.

5. The circuit of claim 4 wherein the second circuit includes a first capacitor and a CMOS transmission gate serially connected between the voltage boosting node and the second pulse signal, the CMOS transmission gate including a first PMOS transistor connected in parallel with a first NMOS transistor, the first NMOS transistor having a gate receiving a power voltage and the first PMOS transistor having a gate receiving the control signal.

6. The circuit of claim 2 wherein the active high voltage detecting circuit includes:
   a voltage circuit including a second PMOS transistor, second to fourth NMOS transistors serially connected between a power voltage and a ground voltage, the second PMOS transistor having a gate connected to a ground voltage, the second and fourth NMOS transistors each having a gate receiving the high voltage, the third NMOS transistor having a gate receiving the active command, a common node between the second and third NMOS transistor generating a detecting signal; and
   a plurality of inverters for generating the active high voltage detecting signal by inverting and buffering the detecting signal.

7. The circuit of claim 2 wherein the variable capacitance control signal generating circuit includes:
   an active command detecting signal generating circuit for generating an active command detecting signal having a predetermined pulse width responsive to the active command;
   a pull-up circuit for increasing a level of the control signal responsive to a down signal;
   a pull-down circuit for decreasing a level of the control signal responsive to an up signal;
   a down signal generating circuit for generating the down signal responsive to the active command; and
   an up signal generating circuit for generating the up signal responsive to the active command.

8. The circuit of claim 2 wherein the variable capacitance control signal generating circuit includes a loop filter for filtering the control signal and adjusting the control signal.

9. The circuit of claim 8 wherein the loop filter includes:
   a plurality of resistors and a second capacitor connected between the control signal and the ground voltage; and
   a common node between the plurality of resistors and the second capacitor, the plurality of resistors and the second capacitor generating the control signal filtered therethrough.

10. A high voltage generating circuit, comprising:
    a variable step-up means for variably boosting a high voltage responsive to a control signal and a first and second pulse signals, the first pulse signal having a phase opposing that of the second pulse signal, the first and second pulse signals being generated responsive to an active command;
    an active high voltage detecting means for generating an active high voltage detecting signal responsive to detecting whether a level of the high voltage is lower than a predetermined level responsive, in turn, to the active command; and
    a variable capacitance control signal generating circuit for varying a level of the control signal responsive to the active high voltage detecting signal and the active command.

11. The circuit of claim 10 comprising an active high voltage step-up circuit being enabled responsive to the active high voltage detecting signal and boosting the high voltage responsive to the first and second pulse signals.

12. The circuit of claim 10 wherein the variable step-up means includes:
    a first step-up circuit for boosting a voltage boosting node responsive to the first pulse signal;
    a second circuit for boosting a level of the voltage boosting node responsive to the second pulse signal; and
    a third circuit for boosting the level of the high voltage when the level of the voltage boosting node is higher than the predetermined level of the high voltage.

13. The circuit of claim 12 wherein the second circuit includes a first capacitor and a CMOS transmission gate serially connected between the voltage boosting node and the second pulse signal, the CMOS transmission gate including a first PMOS transistor connected in parallel to a first NMOS transistor, the first NMOS transistor having a gate for receiving a power voltage, the first PMOS transistor having a gate for receiving the control signal.

14. The circuit of claim 10 wherein the active high voltage detecting circuit includes:
   a voltage circuit including a second PMOS transistor, second to fourth NMOS transistors serially connected between a power voltage and a ground voltage, the second PMOS transistor having a gate connected to a ground voltage, the second and fourth NMOS transistors having a gate for receiving the high voltage, the third NMOS transistor having a gate for receiving the active command, the second and third NMOS transistors having a common node between and generating a detecting signal; and
   a plurality of inverters for generating the active high voltage detecting signal by inverting and buffering the detecting signal.

15. The circuit of claim 10 wherein the variable capacitance control signal generating circuit includes:
   an active command detecting signal generating circuit for generating an active command detecting signal having a predetermined pulse width responsive to the active command;
   a pull-up circuit for increasing a level of the control signal responsive to a down signal;
   a pull-down circuit for decreasing a level of the control signal responsive to an up signal;
   a down signal generating circuit for generating the down signal responsive to the active command; and
   an up signal generating circuit for generating the up signal responsive to the active command.

16. The circuit of claim 10 wherein the variable capacitance control signal generating circuit includes a loop filter for filtering the control signal and adjust the control signal.

17. The circuit of claim 16 wherein the loop filter includes:
   a plurality of resistors and a second capacitor connected between the control signal and the ground voltage; and
   a common node between the plurality of resistors and the second capacitor, the plurality of resistors and the second capacitor for generating the control signal filtered therethrough.

18. A method of generating a high voltage, comprising:
   detecting a level of the high voltage;
   boosting the level of the high voltage when the level is less than a predetermined level;
   variably boosting the level of the high voltage responsive to a control signal and an active command; and
   adjusting a level of the control signal responsive to detecting the high voltage relative to the predetermined level.

19. A method of generating a high voltage, comprising:
   generating first and second pulse signals responsive to an active command;
   variably boosting a level of the high voltage responsive to a control signal and the first and second pulse signals;
   generating a voltage detecting signal responsive to detecting whether the level of the high voltage is lower than a predetermined level responsive to the active command; and
   varying a level of the control signal responsive to the voltage detecting signal and the active command.

20. The method of claim 19 wherein generating the first and second pulse signals includes generating the first pulse signal having a phase opposing that of the second pulse signals.

* * * * *

UNITED STATES PATENT AND TRADEMARK OFFICE
CERTIFICATE OF CORRECTION

PATENT NO.   : 6,690,613 B2
DATED        : February 10, 2004
INVENTOR(S)  : Lim

It is certified that error appears in the above-identified patent and that said Letters Patent is hereby corrected as shown below:

Column 10,
Line 56, "first step-up circuit for boosting" should read -- first circuit for boosting --.
Line 58, "circuit for boosting" should read -- circuit for variably boosting --.

Column 12,
Line 36, "pulse signals." should read -- pulse signal. --.

Signed and Sealed this

Fourth Day of January, 2005

JON W. DUDAS
*Director of the United States Patent and Trademark Office*